US010183368B2

(12) United States Patent
Bang

(10) Patent No.: US 10,183,368 B2
(45) Date of Patent: Jan. 22, 2019

(54) MOVABLE TABLE SYSTEM

(71) Applicant: Inno6 Inc., Suwon-si, Gyeonggi-do (KR)

(72) Inventor: Young Bong Bang, Seoul (KR)

(73) Assignee: Inno6 Inc., Suwon-si (KR)

( * ) Notice: Subject to any disclaimer, the term of this patent is extended or adjusted under 35 U.S.C. 154(b) by 0 days.

(21) Appl. No.: 15/644,294

(22) Filed: Jul. 7, 2017

(65) Prior Publication Data

US 2017/0320177 A1 Nov. 9, 2017

Related U.S. Application Data

(63) Continuation of application No. PCT/KR2016/000038, filed on Jan. 5, 2016.

(30) Foreign Application Priority Data

Jan. 13, 2015 (KR) ........................ 10-2015-0006062

(51) Int. Cl.
*B25B 1/00* (2006.01)
*B23Q 1/60* (2006.01)
*F16M 11/00* (2006.01)
*B23Q 5/28* (2006.01)
*H01L 21/68* (2006.01)

(52) U.S. Cl.
CPC ................. *B23Q 1/60* (2013.01); *B23Q 5/28* (2013.01); *F16M 11/00* (2013.01); *H01L 21/68* (2013.01)

(58) Field of Classification Search
CPC ....... B25B 1/00; B25B 1/2436; B25B 1/2442; B25B 5/06; B25B 11/00; B25B 11/02
See application file for complete search history.

(56) References Cited

U.S. PATENT DOCUMENTS

| 4,409,860 | A | * | 10/1983 | Moriyama | ............. | B23Q 1/621 |
| | | | | | | 108/143 |
| 4,896,869 | A | * | 1/1990 | Takekoshi | ............... | B23P 19/04 |
| | | | | | | 269/309 |
| 5,301,933 | A | * | 4/1994 | Inoue | ..................... | B23Q 5/408 |
| | | | | | | 269/60 |
| 7,654,207 | B1 | | 2/2010 | Shoji et al. | | |

(Continued)

FOREIGN PATENT DOCUMENTS

CN 101556933 A 10/2009
CN 103226342 A 7/2013

(Continued)

OTHER PUBLICATIONS

International Search Report issued in PCT/KR2016/000038; dated Mar. 18, 2016.

(Continued)

*Primary Examiner* — Lee D Wilson
(74) *Attorney, Agent, or Firm* — Studebaker & Brackett PC

(57) ABSTRACT

The present disclosure relates to a movable table system comprising: a table; a first actuator for moving the table in a first direction; a second actuator for moving the table in a second direction; a first linear guide, which is coupled to the first actuator and the table, for guiding the table in the second direction; a second linear guide, which is coupled to the second actuator and the table, for guiding the table in the first direction; and a support portion for supporting the first actuator and the second actuator.

13 Claims, 12 Drawing Sheets

(56) References Cited

U.S. PATENT DOCUMENTS

| | | | | |
|---|---|---|---|---|
| 7,900,896 B2* | 3/2011 | Fujita | ............... | H01J 37/20 |
| | | | | 269/289 R |
| 7,959,141 B2* | 6/2011 | Makino | ............ | G03B 27/62 |
| | | | | 269/58 |
| 2017/0320177 A1* | 11/2017 | Bang | ............ | B23Q 1/60 |

FOREIGN PATENT DOCUMENTS

| | | | |
|---|---|---|---|
| JP | H05-057551 | A | 3/1993 |
| JP | H09-155665 | A | 6/1997 |
| JP | 2001-307983 | A | 11/2001 |
| JP | 2002-343737 | A | 11/2002 |
| JP | 2005-297189 | A | 10/2005 |
| JP | 2008-012638 | A | 1/2008 |
| KR | 2000-0006149 | A | 1/2000 |
| KR | 10-2001-0013820 | A | 2/2001 |
| KR | 10-2008-0083297 | A | 9/2008 |
| KR | 10-2010-0061137 | A | 6/2010 |

OTHER PUBLICATIONS

Written Opinion issued in PCT/KR2016/000038; dated Mar. 18, 2016.

* cited by examiner ly known
MOVABLE TABLE SYSTEM

CROSS-REFERENCE TO RELATED APPLICATIONS

This application is a Continuation Application of PCT International Application No. PCT/KR2016/000038, which was filed on Jan. 5, 2016, and which claims priority from Korean Patent Application No. 10-2015-0006062 filed with the Korean Intellectual Property Office on Jan. 13, 2015. The disclosures of the above patent applications are incorporated herein by reference in their entirety.

BACKGROUND

1. Technical Field

The present disclosure relates generally to a movable table system, more particularly to a table system that allows movement along two perpendicular directions.

2. Description of the Related Art

This section provides background information related to the present disclosure which is not necessarily prior art.

A movable table system, especially one that allows movement along two perpendicular directions, is generally known as an XY table.

FIG. 1 is a drawing disclosed in Korean Patent Publication No. 2001-0013820.

For the sake of convenience, new reference numerals have been assigned.

In FIG. 1, the XY table includes a base 20, guide rails 21 installed on the base 20 along the direction of the x axis, guide rails 22 installed at the ends of the guide rails 21 along the direction of the y axis, an x-axis table 23 arranged on the guide rails 21 and coupled to be movable along the x axis, two guide rollers 24, 25 arranged on the x-axis table 23, an x-axis drive motor 26, an x-axis transport screw 27 connected to the x-axis drive motor 26, a y-axis table 28 arranged on the guide rails 22 and coupled to be movable along the y axis, guide rails 29 of the x-axis direction arranged on the y-axis table 28, a y-axis drive motor 30, a y-axis transport screw 31 connected to the y-axis drive motor 30, and a top table 32 arranged on the x-axis table 23 and the y-axis table 28. With this XY table 10, when the x-axis drive motor 26 is driven, the x-axis table 23 is moved in the direction of the x axis by way of the x-axis transport screw 27 connected to the shaft of the x-axis drive motor 26, and at the same time, the top table 32 is moved in the direction of the x axis by way of the guide rollers 24, 25 provided on the x-axis table 23. When the y-axis drive motor 30 is driven, the y-axis table 28 is moved in the direction of the y axis by way of the y-axis transport screw 31 connected to the shaft of the y-axis drive motor 30, and the top table 32 arranged on the y-axis table 28 is concurrently moved in the direction of the y axis.

However, the movement of the top table 32 in the x-axis and y-axis directions requires the structures of the x-axis table 23, y-axis table 28, and base 20 provided underneath, which may lead to the structure of the XY table 10 having a generally large size and heavy mass. Besides the XY table disclosed in FIG. 1, most XY tables provide movement for the top table by having at least one or more moving tables arranged under the top table. Various types of XY tables, such as those disclosed in Korean Patent Publication No. 2008-0083297, Korean Patent Publication No. 2000-0006149, and Japanese Patent Publication No. 2005-297189, for example, have at least one or more moving tables arranged below the top table. The present disclosure is to resolve the problem found in the related art and provide an XY table system having a simple and lightweight structure.

SUMMARY OF THE INVENTION

The technical problem addressed is set forth in the latter portion of the 'detailed description of the invention' section.

This section provides a general summary of the disclosure and is not a comprehensive disclosure of its full scope or all of its features).

According to one aspect of the present disclosure, a movable table system is provided which includes: a table; a first actuator for moving the table in a first direction; a second actuator for moving the table in a second direction; a first linear guide that is coupled to the first actuator and the table and is configured to guide the table along the second direction; a second linear guide that is coupled to the second actuator and the table and is configured to guide the table along the first direction; and a support portion supporting the first actuator and the second actuator.

The advantages of the present disclosure are set forth in the latter portion of the 'detailed description of the invention' section.

DETAILED DESCRIPTION OF THE INVENTION

The present disclosure will now be described in detail with reference to the accompanying drawings.

Figure 2:
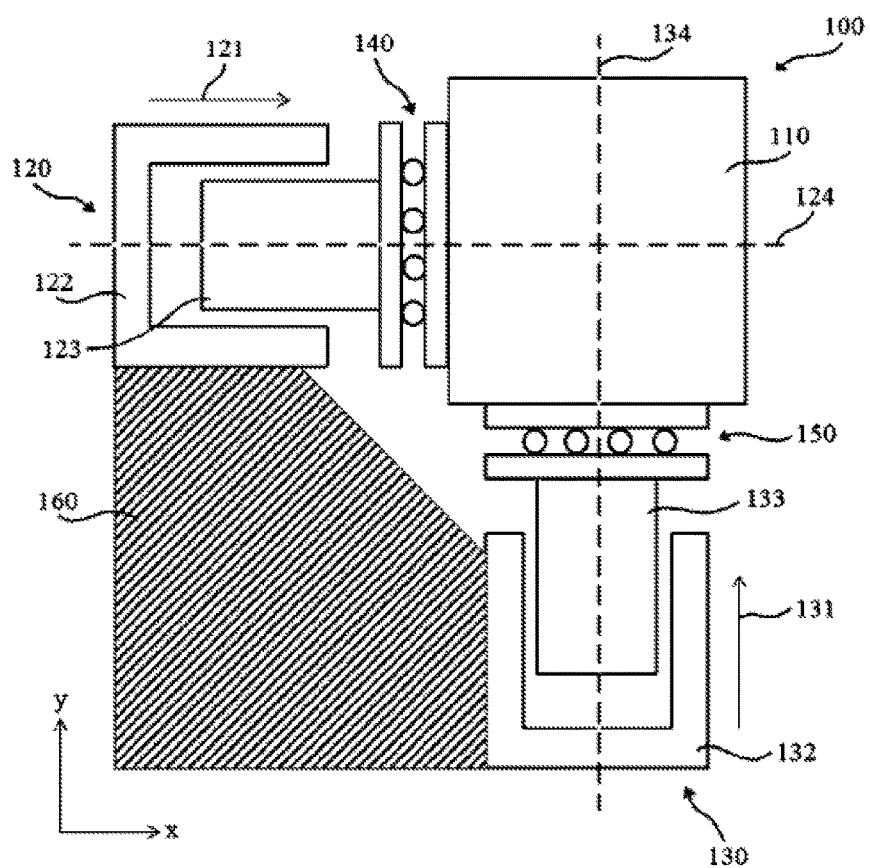
FIG. 2 is a plan view of a movable table system according to the present disclosure.

FIG. 2 is a plan view of a movable table system according to the present disclosure.

A movable table system 100 according to the present disclosure may include a table 110, a first actuator 120 that moves the table in a first direction 121, a second actuator 130 that moves the table 110 in a second direction 131, a first linear guide 140 that is coupled to the first actuator 120 and the table 110 to guide the table 110 along the second direction 131, a second linear guide 150 that is coupled to the second actuator 130 and the table 110 to guide the table 110 along the first direction 121, and a support portion 160 that supports the first actuator 120 and the second actuator 130.

Figure 1:
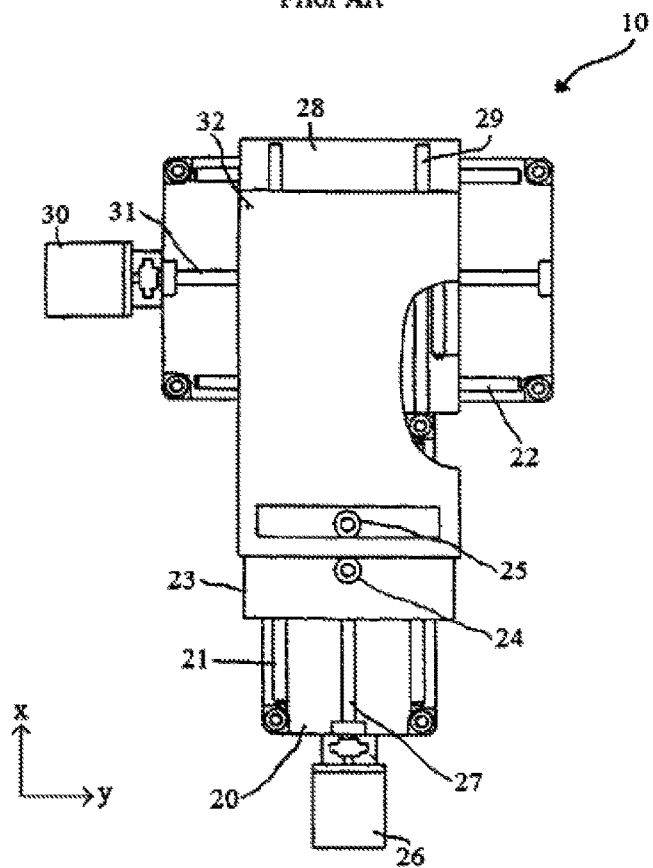
FIG. 1 is a drawing disclosed in Korean Patent Publication No. 2001-0013820.

The table 110 is one that can move in the first direction 121 and second direction 131, corresponding to the top table in the XY table of FIG. 1. In the context of a laser processing apparatus, a laser source can be placed on the table 110, whereas in the context of wire bonding for semiconductor manufacturing, a bonding head can be placed.

The first actuator 120 and second actuator 130 may move the table 110 in the first direction 121 and second direction 131, respectively.

The first actuator 120 and the second actuator 130 can be implemented as the drive motors connected with transport screws shown in FIG. 1, but for high-speed control, they may preferably be implemented as linear motors equipped with drive parts 122, 132 and movement parts 123, 133. Although it is not shown in the drawings, it is well known to the skilled person that the movement part 123, 133 and the drive part 122, 132 of a linear motor are coupled by way of a linear guide. Preferably, the center lines of the first actuator and second actuator may intersect perpendicularly. When the center lines 124, 134 of the first actuator 120 and second actuator 130 intersect perpendicularly, the first direction 121 can be referred to as the x direction, and the second direction can be referred to as the y direction 131.

The first linear guide 140 may directly connect the table 110 with the first actuator 120.

The first linear guide 140 may guide the table such that, when the second actuator 130 moves the table 110 in the second direction 131, only the table 110 is moved in the second direction 131 and the first actuator 120 is not moved.

The second linear guide 150 may directly connect the table 110 with the second actuator 130.

The second linear guide 150 may guide the table such that, when the first actuator 120 moves the table 110 in the first direction 121, only the table 110 is moved in the first direction 121 and the second actuator 130 is not moved.

In cases where the first actuator 120 and the second actuator 130 are linear motors, the drive parts 122, 132 may be coupled to the support portion 160 and be supported by the support portion 160.

The support portion 160 is not limited to a particular form as long as it is for supporting the drive parts 122, 132. In cases where the first actuator 120 and the second actuator 140 are not linear motors, for example if they are drive motors as in FIG. 1, the drive motors can be coupled to the support portion 160. Also, although it is not shown in the drawings, the support portion 160 can be composed of two support portions that are coupled to the first actuator 120 and second actuator 130, respectively.

Figure 3A:
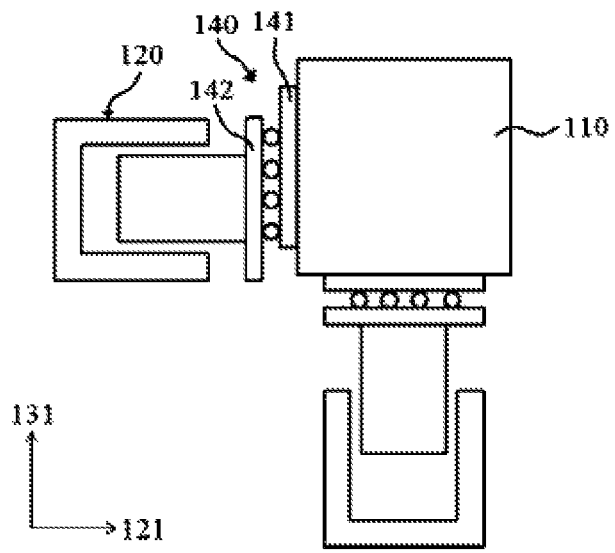
FIG. 3A, FIG. 3B, and FIG. 3C illustrate the movements of a first linear guide and second linear guide according to the present disclosure.
Figure 3B:
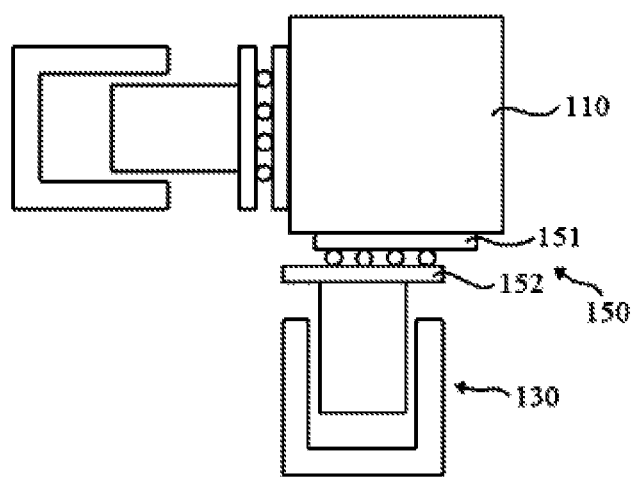
Figure 3C:
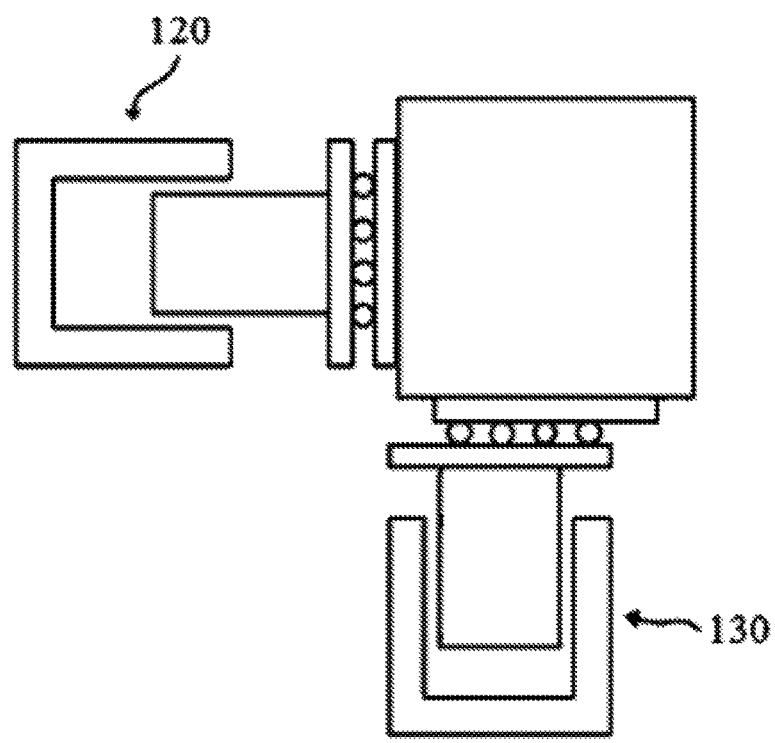

FIGS. 3A to 3C illustrate the movements of a first linear guide and second linear guide according to the present disclosure.

In FIG. 3A, the first linear guide 140 includes a first side portion 141, which couples with the table 110, and a second side portion 142, which couples with the first actuator 120. When the table 110 is moved in the second direction 131, the first side portion 141 of the first linear guide 140 may move together with the table 110 in the second direction 131, but the second side portion 142 coupled with the first actuator 120 may not move.

In FIG. 3B, the second linear guide 150 includes a first side portion 151, which couples with the table 110, and a second side portion 152, which couples with the second actuator 130. When the table 110 is moved in the first direction 121, the first side portion 151 of the second linear guide 150 may move together with the table 110 in the first direction 121, but the second side portion 152 coupled with the first second actuator 130 may not move.

FIG. 3C shows the first actuator 120 and the second actuator 130 operating simultaneously. For the sake of convenience, the support portion is not shown in FIGS. 3A and 3B.

Figure 4:
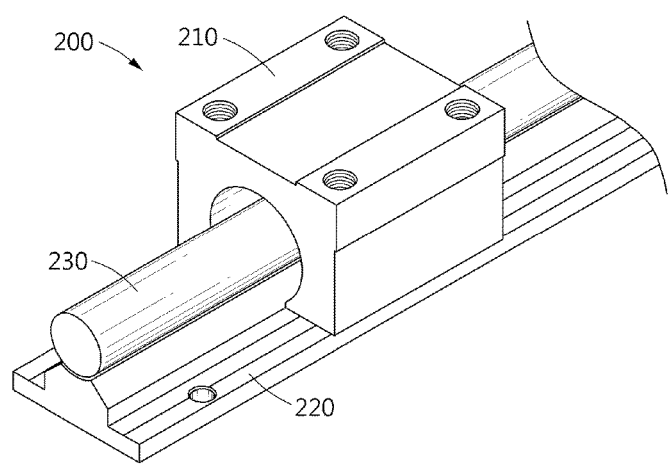
FIG. 4 is a diagram illustrating an example of a linear guide according to the present disclosure.

FIG. 4 is a diagram illustrating an example of a linear guide according to the present disclosure.

In a linear guide 200 that can be used according to the present disclosure, the part that moves in a straight line, such as the first side portion 210 to which the table 110 is secured in FIG. 3 for example, can move along a rail 230. Also, the part that does not move, such as the second side portion 220 to which the first and second actuators 120, 130 are secured in FIG. 3 for example, does not move along the rail 230. The linear guide 200 disclosed in FIG. 4 is an example of a linear guide that can be used in the present disclosure, and all types of linear guide capable of performing the same function can be included in the present disclosure.

Figure 5:
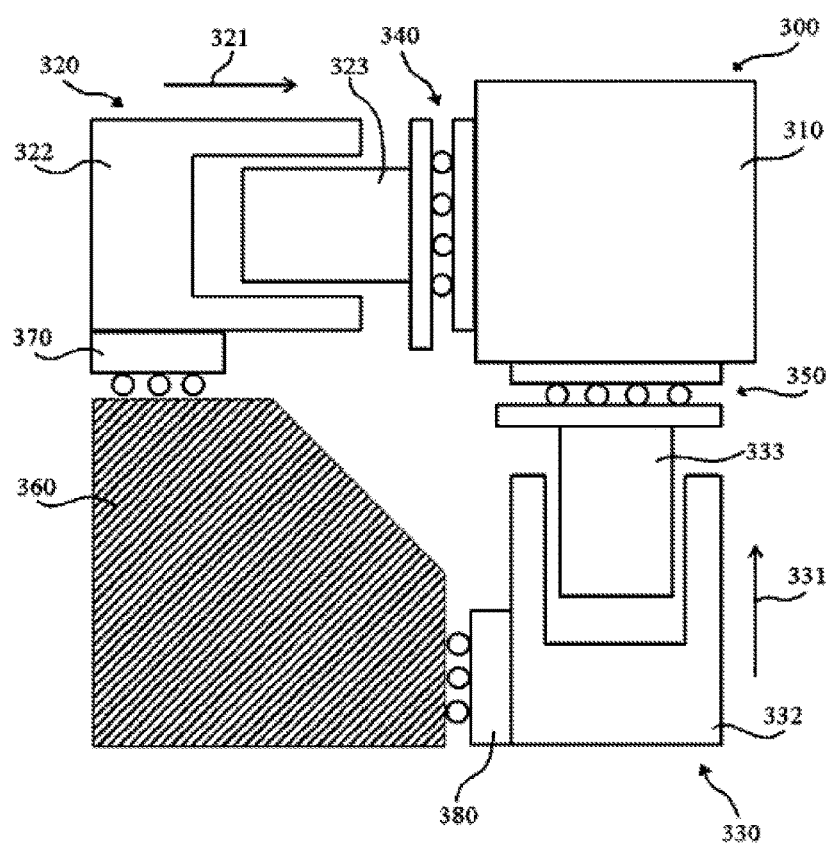
FIG. 5 is a plan view of another example of a movable table system according to the present disclosure.

FIG. 5 is a plan view of another example of a movable table system according to the present disclosure.

A movable table system 300 according to another example based on the present disclosure may include a table 310, a first linear motor 320 that includes a drive part 322 and a movement part 323 and moves the table 310 in a first direction 321, a second linear motor 330 that includes a drive part 332 and a movement part 333 and moves the table 310 in a second direction 331, a first linear guide 340 that is coupled to the first linear motor 320 and the table 310 to guide the table 310 along the second direction 321, a second linear guide 350 that is coupled to the second linear motor 330 and the table 310 to guide the table 310 along the first direction 321, a support portion 360 that supports the first linear motor 320 and the second linear motor 330, a third linear guide 370 coupled with the drive part 322 of the first linear motor 320 and the support portion 360 to guide the drive part 322 of the first linear motor 320 along the first direction 321, and a fourth linear guide 380 coupled with the drive part 332 of the second linear motor 330 and the support portion 360 to guide the drive part 332 of the second linear motor 330 along the second direction 331.

In cases where the drive parts 322, 332 of the first linear motor 320 and second linear motor 330 are secured to the support portion 360, the reaction forces resulting from the movement by the movement parts 323, 333 of the first linear motor 320 and second linear motor 330 may be transferred directly to the support portion 360 and cause the support portion 360 to shake. To resolve this problem, the present disclosure may use a third and a fourth linear guide 370, 380 to connect the support portion 360 with the drive parts 322, 332 of the first linear motor 320 and second linear motor 330. That is, using the third and fourth linear guides 370, 380 allows the drive parts 322, 332 of the first linear motor 320 and second linear motor 330 to be moved over the support portion 360 by the reaction forces of the movement parts 323, 333. Preferably, the third and fourth linear guides 370, 380 may be implemented such that the parts to which the support portion 360 is coupled do not move and the parts to which the drive parts 322, 332 of the first linear motor 320 and second linear motor 330 do move. The linear guide disclosed in FIG. 4 or a cross-roller table can be used.

Figure 6A:
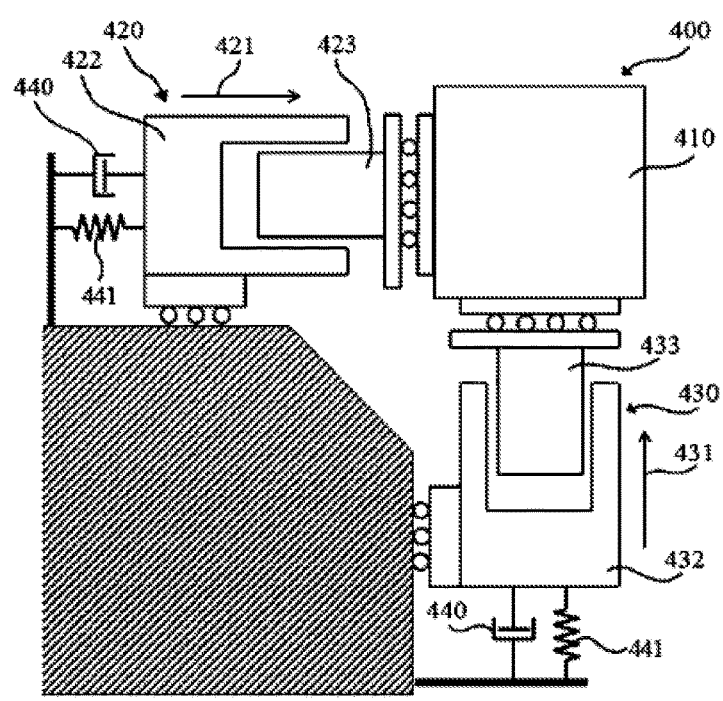
FIG. 6A and FIG. 6B are plan views of other examples of a movable table system according to the present disclosure.
Figure 6B:
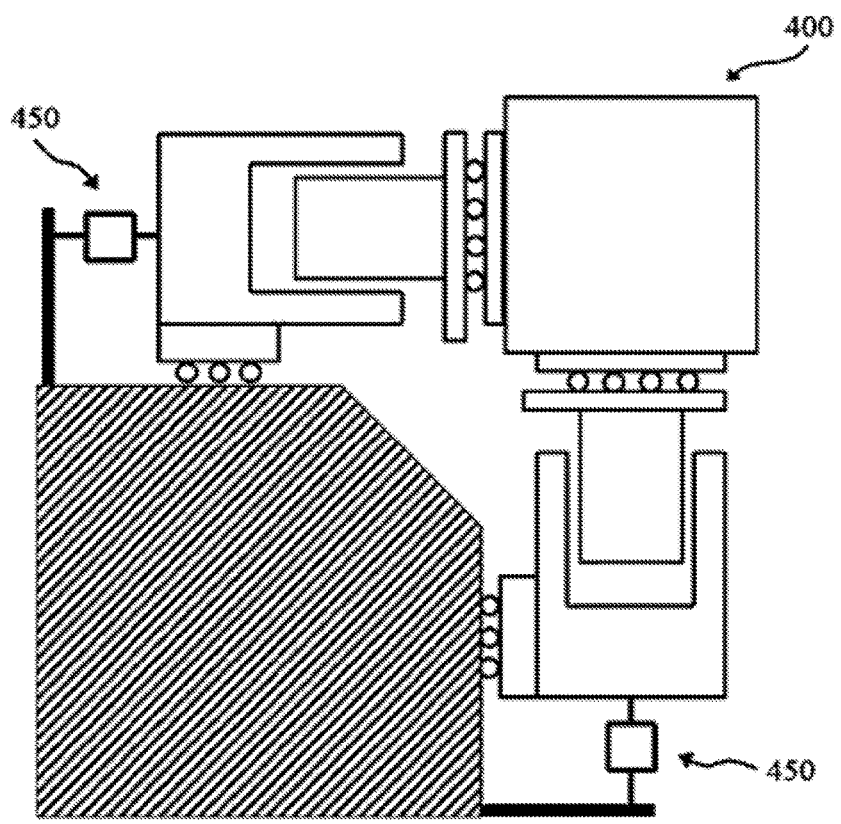

FIGS. 6A and 6B are plan views of other examples of a movable table system according to the present disclosure.

The movable table systems 400 disclosed in FIG. 6A and FIG. 6B include position adjuster parts 440, 441, 450 added to the drive parts 422, 432 of the first linear motor 420 and second linear motor 430. It would be preferable to have the drive parts 422, 432 of the first linear motor 420 and second linear motor 430 return to their original positions after they have been moved backwards by the reaction forces from the movement parts 423, 433 of the first linear motor 420 and second linear motor 430. For this, the position adjuster parts 440, 441, 450 may further be included. For the position adjuster part, a combination of a damper 440 and a spring 441 coupled together can be used as in FIG. 6A, or an actuator 450 can be used as in FIG. 6B. The actuator 450 can be a linear motor. If an actuator 450 is used for the position adjuster part, there is also the advantage that the movement of the drive parts 422, 432 due to inertial reaction forces can be actively prevented when the movable table system 400 is accelerated or decelerated while installed on an XY table (not shown) of a long stroke.

FIGS. 7A to 7D are plan views illustrating an example of using a movable table system according to the present disclosure in a laser processing apparatus.

Movable table systems according to the present disclosure may include those that use a laser head, for emitting a laser beam, attached directly onto the table and those that use a laser head installed on the exterior of the movable table system. FIGS. 7A to 7D show an example of using a movable table system according to the present disclosure for a laser processing apparatus using a laser source installed on the exterior.

A movable table system 500 installed with a laser source according to the present disclosure may include a table 510, a first linear motor 520 that includes a drive part 522 and a movement part 523 and moves the table 510 in a first direction 521, a second linear motor 530 that includes a drive part 532 and a movement part 533 and moves the table 510 in a second direction 531, a first linear guide 540 that is coupled to the first linear motor 520 and the table 510 to guide the table 510 along the second direction 521, a second linear guide 550 that is coupled to the second linear motor 530 and the table 510 to guide the table 510 along the first direction 521, a support portion 560 that supports the first linear motor 520 and the second linear motor 530, a first reflector part 580 that is installed on at least one of the movement parts 523, 533 of the first linear motor 520 and second linear motor 530 and alters the path 570 of a beam entering the movable table system 500 from the exterior, and a second reflector part 590 installed on the table 510 that alters the path of the beam such that the path 571 of the beam directed to the table 510 by the first reflector part 580 leaves the table 510. Although the path of the beam leaving the table 510 is not shown in the drawings, it may be preferable that the beam leaves in a direction perpendicular to the surface 511 of the table 510. The first reflector part 580 and second reflector part 590 are not limited in terms of the particular forms that can be used, as long as they can keep the loss of the laser beam low. For example, it would be possible to use a mirror. Also, lenses can be added to the table 510 so that a laser beam coming from the second reflector part 590 may be better concentrated to one point.

Figure 7A:
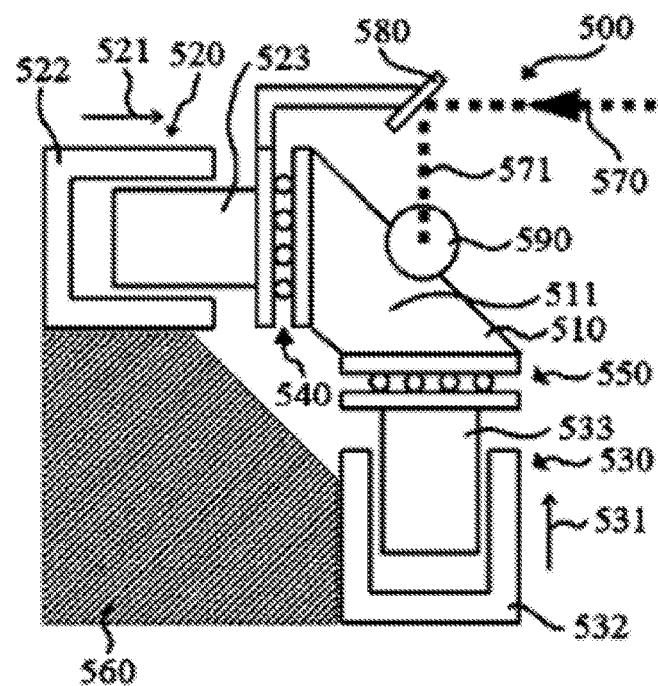
FIG. 7A, FIG. 7B, FIG. 7C, and FIG. 7D are plan views illustrating an example of using a movable table system according to the present disclosure in a laser processing apparatus.
Figure 7B:
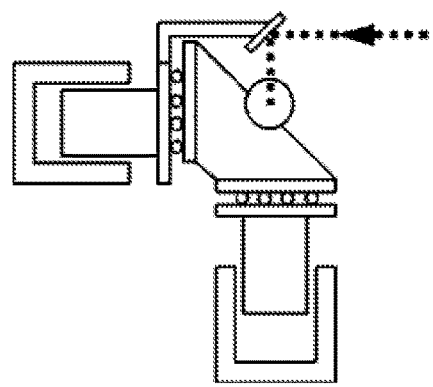
Figure 7C:
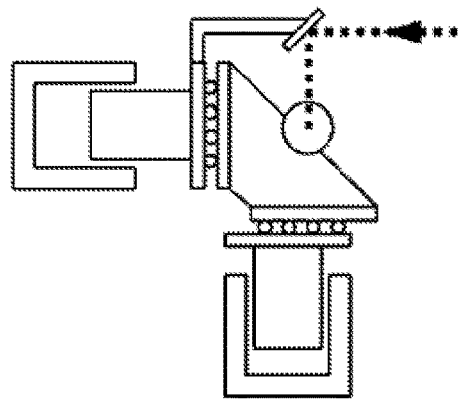
Figure 7D:
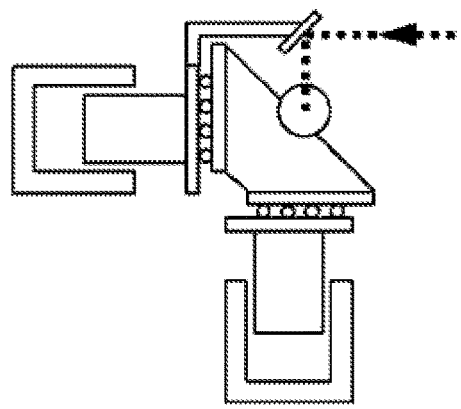

FIG. 7B illustrates the path of a beam when the first linear motor 520 is operated, FIG. 7C illustrates the path of a beam when the second linear motor 530 is operated, and FIG. 7D illustrates the path of a beam when both the first linear motor 520 and the second linear motor 530 are operated. FIGS. 7B to 7D show an example in which a laser beam generated from the exterior is transferred to the table for use in laser processing. For the sake of convenience, the support portion is not shown in FIGS. 7B to 7D.

Figure 8:
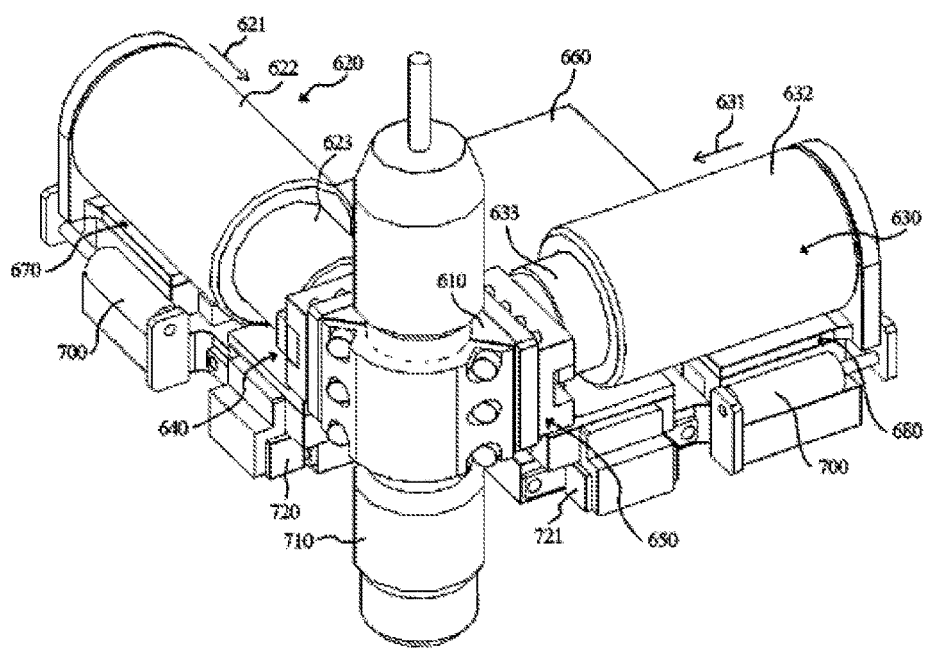
FIG. 8 is a 3D drawing illustrating an example of a movable table system according to the present disclosure.

FIG. 8 is a 3D drawing illustrating an example of a movable table system according to the present disclosure.

FIG. 8 is a 3D drawing of the movable table system disclosed in FIG. 6A.

The 3D depiction of the movable table system 600 shows a table 610, a first linear motor 620 that includes a drive part 622 and a movement part 623 and moves the table 610 in a first direction 621, a second linear motor 630 that includes a drive part 632 and a movement part 633 and moves the table 610 in a second direction 631, a first linear guide 640 that is coupled to the first linear motor 620 and the table 610 to guide the table 610 along the second direction 621, a second linear guide 650 that is coupled to the second linear motor 630 and the table 610 to guide the table 610 along the first direction 621, a support portion 660 that supports the first linear motor 620 and the second linear motor 630, a third linear guide 670 coupled with the drive part 622 of the first linear motor 620 and the support portion 660 to guide the drive part 622 of the first linear motor 620 along the first direction 621, a fourth linear guide 680 coupled with the drive part 632 of the second linear motor 630 and the support portion 660 to guide the drive part 632 of the second linear motor 630 along the second direction 631, and position adjuster parts 700 that each include a damper and a spring to return the drive parts 622, 632 of the first linear motor 620 and second linear motor 630 to their original positions after these are moved backwards by the reaction forces of the movement parts 623, 633 of the first linear motor 620 and second linear motor 630. Also illustrated is a laser head 710 mounted on the table 610. Also, a first position sensor 720 for the movement part 623 of the first linear motor 620 and a second position sensor 721 for the movement part 633 of the second linear motor 630 are illustrated.

Figure 9:
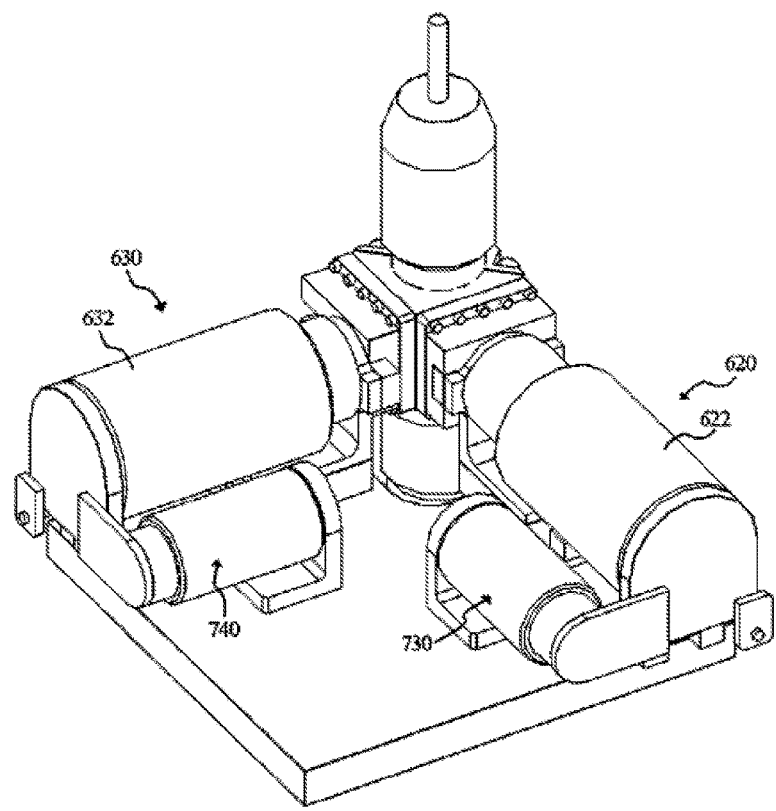
FIG. 9 is a 3D drawing illustrating another example of a movable table system according to the present disclosure.

FIG. 9 is a 3D drawing of a movable table system according to the present disclosure.

FIG. 9 is a 3D depiction of the movable table system disclosed in FIG. 6B, showing the damper and spring configuration of the position adjuster in the 3D depiction of the movable table system in FIG. 8 replaced by linear motors. That is, an example is shown in which a third linear motor 730 and a fourth linear motor 740 are used to adjust the positions of the drive parts 622, 632 of the first linear motor 620 and second linear motor 630.

A summary of the various implementations disclosed herein is provided below.

(1) a movable table system that includes a table, a first actuator that moves the table in a first direction, a second actuator that moves the table in a second direction, a first linear guide that is coupled to the first actuator and the table to guide the table along the second direction, a second linear guide that is coupled to the second actuator and the table to guide the table along the first direction, and a support portion that supports the first actuator and the second actuator (2) a movable table system in which the first actuator and the second actuator are linear motors, and the linear motors each include a drive part and a movement part (3) a movable table system in which the center line of the first actuator and the center line of the second actuator intersect perpendicularly (4) a movable table system in which the first linear guide and the second linear guide each include a first side portion coupling with the table and a second side portion coupling with the first actuator and second actuator, respectively, where the first side portion of the first linear guide moves along the second direction, the second side portion of the first linear guide is fixed with respect to the second direction, the first side portion of the second linear guide moves along the first direction, and the second side portion of the second linear guide is fixed with respect to the first direction (5) a movable table system that includes at least one of a third linear guide coupled with the drive part of the first linear motor and the support portion to guide the drive part of the first linear motor along the first direction, and a fourth linear guide coupled with the drive part of the second linear motor and the support portion to guide the drive part of the second linear motor along the second direction (6) a movable table system in which the drive parts of the first linear motor and the second linear motor are moved by reaction forces occurring due to the movements of the movement parts of the first linear motor and second linear motor in opposite directions of the movements of the movement parts, respectively (7) a movable table system that includes a position adjuster part interworking with the drive part of at least one of the first linear motor and the second linear motor to move the drive part to an original position after the drive part is moved by a reaction force occurring due to the movement of the movement part of the first linear motor and second linear motor (8) a movable table system of in which the position adjuster part comprises a damper and a spring (9) a movable table system of in which the position adjuster part is a linear motor

(10) a movable table system that includes a first reflector part interworking with the movement part of at least one of the first linear motor and the second linear motor to alter the path of a beam entering from the exterior into the movable table system towards a direction of the table

(11) a movable table system that includes a second reflector part configured to alter the path of a beam such that the beam directed to the table by the first reflector part moves away from the table

(12) a movable table system in which the path of the beam reflected by the second reflector part to move away from the table is perpendicular to the surface of the table

(13) a movable table system that includes a lens for concentrating the beam reflected by the second reflector part and moving away from the table

(14) a movable table system in which a laser head is installed on the table

(15) a movable table system that includes at least one of a first position sensor for measuring the displacement of the movement part of the first linear motor in relation to the support portion, and a second position sensor for measuring the displacement of the movement part of the second linear motor in relation to the support portion According to the present disclosure, it is possible to build a movable table system having a light mass.

According to the present disclosure, a movable table system can be implemented that has a simple structure and a light mass to enable easier high-speed control.

According to the present disclosure, it is possible to build a laser processing apparatus which uses a movable table system having a simple structure and a light mass to enable easier high-speed control.

What is claimed is:

1. A movable table system comprising:
    a table;
    a first linear motor comprising a drive part and a movement part, for moving the table in a first direction;
    a second linear motor comprising a drive part and a movement part, for moving the table in a second direction;
    a first linear guide coupled to the first linear motor and the table, the first linear guide configured to guide the table along the second direction;
    a second linear guide coupled to the second linear motor and the table, the second linear guide configured to guide the table along the first direction; and
    a support portion supporting the first linear motor and the second linear motor;
    at least one of:
    a third linear guide coupled with the drive part of the first linear motor and the support portion to guide the drive part of the first linear motor along the first direction; and
    a fourth linear guide coupled with the drive part of the second linear motor and the support portion to guide the drive part of the second linear motor along the second direction.

2. The movable table system of claim 1, wherein a center line of the first linear motor and a center line of the second linear motor intersect perpendicularly.

3. The movable table system of claim 1, wherein the first linear guide and the second linear guide comprise a first side portion coupling with the table and a second side portion coupling with the first linear motor and second linear motor, respectively,
    the first side portion of the first linear guide moves along the second direction, and the second side portion of the first linear guide is fixed with respect to the second direction, and
    the first side portion of the second linear guide moves along the first direction, and the second side portion of the second linear guide is fixed with respect to the first direction.

4. The movable table system of claim 1, wherein the drive parts of the first linear motor and the second linear motor are moved by reaction forces occurring due to movements of the movement parts of the first linear motor and the second linear motor in opposite directions of the movements of the movement parts, respectively.

5. The movable table system of claim 1, further comprising:
    a position adjuster part interworking with the drive part of at least one of the first linear motor and the second linear motor to move the drive part to an original position after the drive part is moved by a reaction force occurring due to movements of the movement parts of the first linear motor and the second linear motor.

6. The movable table system of claim 5, wherein the position adjuster part comprises a damper and a spring.

7. The movable table system of claim 5, wherein the position adjuster part is a linear motor.

8. The movable table system of claim 1, further comprising:
    a first reflector part interworking with the movement part of at least one of the first linear motor and the second linear motor to alter a path of a beam entering from an exterior into the movable table system towards a direction of the table.

9. The movable table system of claim 8, further comprising:
    a second reflector part configured to alter a path of a beam such that the beam directed to the table by the first reflector part moves away from the table.

10. The movable table system of claim 9, wherein the path of the beam reflected by the second reflector part to move away from the table is perpendicular to a surface of the table.

11. The movable table system of claim 9, further comprising:
  a lens for concentrating the beam reflected by the second reflector part to move away from the table.

12. The movable table system of claim 1, wherein a laser head is installed on the table.

13. The movable table system of claim 1, further comprising at least one of:
  a first position sensor for measuring a displacement of the movement part of the first linear motor in relation to the support portion; and
  a second position sensor for measuring a displacement of the movement part of the second linear motor in relation to the support portion.

* * * * *